(12) United States Patent
Kim et al.

(10) Patent No.: US 9,827,742 B2
(45) Date of Patent: Nov. 28, 2017

(54) FLEXIBLE DISPLAY AND METHOD OF MANUFACTURING THE SAME

(71) Applicant: Samsung Display Co., Ltd., Yongin, Gyeonggi-Do (KR)

(72) Inventors: Min-Jae Kim, Yongin (KR); Hyun-Ah Suh, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 14/574,119

(22) Filed: Dec. 17, 2014

(65) Prior Publication Data

US 2015/0314561 A1 Nov. 5, 2015

(30) Foreign Application Priority Data

Apr. 30, 2014 (KR) ........................ 10-2014-0052978

(51) Int. Cl.
| | |
|---|---|
| *B32B 7/14* | (2006.01) |
| *B32B 7/04* | (2006.01) |
| *B32B 27/08* | (2006.01) |
| *B32B 27/30* | (2006.01) |
| *B32B 37/18* | (2006.01) |
| *B32B 37/00* | (2006.01) |
| *B32B 37/12* | (2006.01) |
| *H01L 51/00* | (2006.01) |
| *H01L 27/32* | (2006.01) |

(52) U.S. Cl.
CPC ............... *B32B 7/14* (2013.01); *B32B 7/045* (2013.01); *B32B 27/08* (2013.01); *B32B 27/302* (2013.01); *B32B 27/306* (2013.01); *B32B 27/308* (2013.01); *B32B 37/0076* (2013.01); *B32B 37/025* (2013.01); *B32B 37/12* (2013.01); *B32B 37/1292* (2013.01); *B32B 37/182* (2013.01); *H01L 51/0097* (2013.01); *B32B 2307/412* (2013.01); *B32B 2307/414* (2013.01); *B32B 2307/416* (2013.01); *B32B 2457/20* (2013.01); *B32B 2457/206* (2013.01); *H01L 27/3244* (2013.01); *Y02E 10/549* (2013.01); *Y02P 70/521* (2015.11); *Y10T 156/10* (2015.01); *Y10T 428/24851* (2015.01)

(58) Field of Classification Search
None
See application file for complete search history.

(56) References Cited

U.S. PATENT DOCUMENTS

| | | |
|---|---|---|
| 7,863,617 B2 | 1/2011 | Hioki et al. |
| 8,237,165 B2 | 8/2012 | Kim et al. |

(Continued)

FOREIGN PATENT DOCUMENTS

| | | | |
|---|---|---|---|
| JP | 2005-347083 A | 12/2005 | |
| JP | 2008-026910 A | 2/2008 | |

(Continued)

*Primary Examiner* — Laura Powers
(74) *Attorney, Agent, or Firm* — Knobbe Martens Olson & Bear LLP

(57) ABSTRACT

A flexible display is disclosed. In one aspect, the display includes a flexible substrate and a protection film formed over the flexible substrate. The display further includes a layer of adhesive material formed between the flexible substrate and the protection film, wherein a plurality of patterns are formed in the adhesive layer.

9 Claims, 4 Drawing Sheets

(56) References Cited

U.S. PATENT DOCUMENTS

| | | | |
|---|---|---|---|
| 2005/0153107 A1* | 7/2005 | Iijima | B32B 17/10018 428/195.1 |
| 2005/0269948 A1 | 12/2005 | Tanaka | |
| 2007/0062639 A1* | 3/2007 | Chang | B32B 37/1292 156/291 |
| 2012/0161197 A1 | 6/2012 | Im et al. | |
| 2014/0008657 A1* | 1/2014 | Lu | H01L 33/16 257/59 |
| 2014/0367707 A1* | 12/2014 | Meng | H01L 27/3253 257/88 |

FOREIGN PATENT DOCUMENTS

| | | |
|---|---|---|
| KR | 10-2010-0130898 A | 12/2010 |
| KR | 10-2012-0037665 A | 4/2012 |
| KR | 10-2012-0071962 A | 7/2012 |

* cited by examiner

FLEXIBLE DISPLAY AND METHOD OF MANUFACTURING THE SAME

INCORPORATION BY REFERENCE TO ANY PRIORITY APPLICATIONS

This application claims the benefit of Korean Patent Application No. 10-2014-0052978, filed on Apr. 30, 2014, in the Korean Intellectual Property Office, the disclosure of which is incorporated herein in its entirety by reference.

BACKGROUND

Field

The described technology generally relates to a flexible display and a method of manufacturing the same.

Description of the Related Technology

Due to recently increased interest in a flexible display, research on this technology is being actively conducted. To attain such flexible display, a flexible substrate formed of a material such as synthetic resin is used instead of a glass substrate. The flexible substrate has flexible properties and thus, it has problems such as difficulty in handling during manufacturing. Accordingly, to resolve such problems, the flexible substrate may be formed on a support substrate having sufficient rigidity and passed through various processes, and then the flexible substrate is separated from the support substrate.

SUMMARY OF CERTAIN INVENTIVE ASPECTS

One inventive aspect is a flexible display relieved of stress during folding and a method of manufacturing the same.

Another aspect is a flexible display relieved of stress during folding and a method of manufacturing the same to resolve various problems such as the problems described above. However, the embodiments are for illustrative purposes only and thus, the scope of the present invention is not limited thereto.

Another aspect is a flexible display including a flexible substrate, a protection film formed on one surface of the flexible substrate, and an adhesive layer formed between the flexible substrate and the protection film and formed to have a plurality of patterns.

The adhesive layer may have a polygonal, a circular, or an oval-shaped pattern.

An adhesive material may be absent between the plurality of patterns of the adhesive layer.

Another aspect is a flexible display including a flexible substrate; a protection film formed on one surface of the flexible substrate and formed to have a plurality of patterns; and an adhesive layer formed between the flexible substrate and the protection film.

The protection film may have a polygonal, a circular, or an oval-shaped pattern.

An adhesive material may be absent between the plurality of patterns of the protection film.

The protection film may not be formed between the plurality of patterns of the protection film.

An adhesive material may be absent between the plurality of patterns of the protection film.

The flexible substrate may be exposed between the plurality of patterns of the protection film.

Another aspect is a method of manufacturing a flexible display, the method including preparing a flexible substrate; forming an adhesive layer having a plurality of patterns on one surface of the flexible substrate; and disposing a protection film on one surface of the flexible substrate formed on the adhesive layer.

The adhesive layer may include a polygonal, a circular, or an oval-shaped pattern.

An adhesive material may be absent between the plurality of patterns. Such general and detailed aspects may be achieved by using a system, a method, a computer program, or a combination of any system, method, and computer program.

Another aspect is a flexible display comprising: a flexible substrate; a protection film formed over the flexible substrate; and a layer of adhesive material formed between the flexible substrate and the protection film, wherein a plurality of patterns are formed in the adhesive layer. In the above display, the patterns comprise a polygonal, a circular, or an oval-shaped pattern. In the above display, the adhesive material is absent between the patterns of the adhesive layer. In the above display, the adhesive material directly contacts the flexible substrate and the protection film. In the above display, the width of the adhesive material is substantially the same as that of the protection film. In the above display, the layer of adhesive material is discontinuous.

Another aspect is a flexible display comprising: a flexible substrate; a protection film formed over the flexible substrate, wherein a plurality of patterns are formed in the protection film; and a layer of adhesive material formed between the flexible substrate and the protection film. In the above display, the patterns comprise a polygonal, a circular, or an oval-shaped pattern. In the above display, the protection film is not formed between the patterns of the protection film. In the above display, the adhesive material is absent between the patterns of the protection film. In the above display, the flexible substrate is exposed between the patterns of the protection film. In the above display, the adhesive material directly contacts the flexible substrate and the protection film. In the above display, the width of the adhesive material is substantially the same as that of the protection film. In the above display, each of the adhesive layer and the protection film is discontinuous.

Another aspect is a method of manufacturing a flexible display, the method comprising: providing a flexible substrate; forming an adhesive layer having a plurality of patterns on the flexible substrate; and forming a protection film on the adhesive layer. In the above method, the patterns comprise a polygonal, a circular, or an oval-shaped pattern. In the above method, the adhesive material in the adhesive layer is absent between the patterns. In the above method, the adhesive material directly contacts the flexible substrate and the protection film. In the above method, the width of the adhesive material is substantially the same as that of the protection film. In the above method, the adhesive layer is discontinuous.

DETAILED DESCRIPTION OF CERTAIN INVENTIVE EMBODIMENTS

Figure 1:
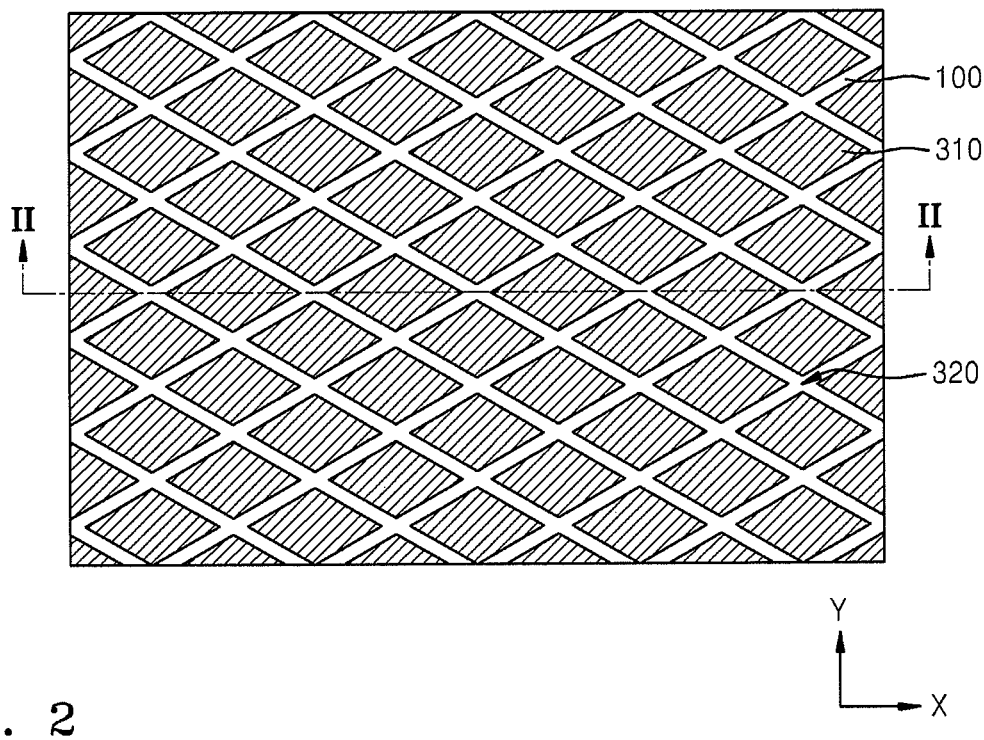
FIG. 1 is a bottom plan view schematically showing a flexible display according to an embodiment.

Generally, an adhesive material is formed between a flexible substrate and a bottom film for attachment after the flexible substrate has been separated from a support substrate. Stress can be applied to the flexible substrate during folding due to application of the adhesive material.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the invention allows for various changes and numerous embodiments, exemplary embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are also encompassed by this disclosure.

While such terms as "first"," "second"," etc., may be used to describe various components, such components must not be limited to the above terms. The above terms are used only to distinguish one component from another. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto. In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Figure 2:
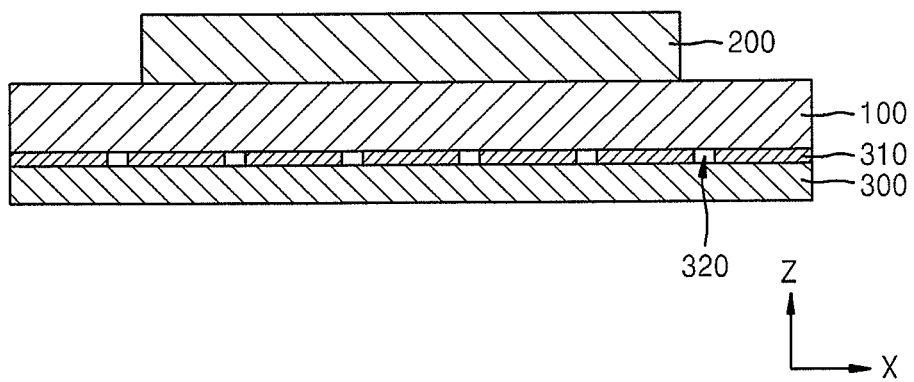
FIG. 2 is a cross-sectional view schematically showing a cross-section of the flexible display of FIG. 1 taken along a line direction.

Referring to FIGS. 1 and 2, the flexible display includes a flexible substrate 100 and an organic light-emitting device 200 placed on the flexible substrate 100, a protection film 300, and an adhesive layer or a layer of adhesive material 310.

The flexible substrate 100 has flexible properties and may be formed of various materials such as a metal material and a plastic material such as polyethyelene terephthalate (PET), polyethylene naphthalate, or polyimide.

The organic light-emitting device 200 may be placed on the flexible substrate 100 and includes a plurality of pixels to form a display layer (not shown). For example, the display layer (not shown) may be an organic light-emitting display layer including a plurality of thin film transistors TFTs and pixel electrodes that are connected to the TFTs or a liquid crystal display layer.

The protection film 300 may be formed on one surface of the flexible substrate 100 and as described above, the organic light-emitting device 200 may be placed on the flexible substrate 100 and the protection film 300 may be formed under the flexible substrate 100. The protection film 300 may be formed under substantially the entire surface of the flexible substrate 100. The flexible substrate 100 may be formed of a plastic material that has lower rigidity than a glass substrate and thus, the protection film 300 may be attached under the flexible substrate 100 to protect the flexible substrate 100 from external scratches and improve durability of the flexible substrate 100. The protection film 300 may have flexible properties such as those of the flexible substrate 100 and may be formed of, for example, a plastic material such as polyethyelene terephthalate (PET), polyethyelene naphthalate (PEN), and polyimide.

The adhesive layer 310 may be formed between the flexible substrate 100 and the protection film 300, such that the protection film 300 may be attached to the flexible substrate 100. The adhesive layer 310 may be formed of silicon, but any material that has adhesive properties may be used. The adhesive layer 310 may have sufficient adhesiveness to attach the protection film 300 to the flexible substrate 100 and have adhesiveness of about 0.01 kgf/cm$^2$ to about 10 kgf/cm$^2$, but the adhesive layer 310 is not limited thereto and may be variously changed depending on size and material of the flexible substrate 100 and the protection film 300.

The adhesive layer 310 may be formed to have a plurality of patterns as illustrated in FIG. 1. In FIG. 1, the adhesive layer 310 is illustrated to have a diamond-shaped pattern, but the adhesive layer 310 is not limited thereto and may have various patterns such as a polygonal, a circular, or an oval-shaped pattern, in addition to the diamond-shaped pattern.

As described above, the adhesive layer 310 is formed to have a plurality of patterns, and thus, a pattern gap 320 may be formed between a plurality of patterns of the adhesive layer 310, in which the adhesive material is absent. The pattern gap 320 may have a size of about 0.05 mm to about 1 mm, for example, about 0.1 mm, but it is not limited thereto.

Alternatively, when the adhesive layer 310 is formed over substantially the entire surface of the flexible substrate 100, between the protection film 300 and the flexible substrate 100, tensile and pressure stress is applied to a bending portion when the flexible substrate 100 is bent. In this regard, when the adhesive layer 310 is formed over substantially the entire surface of the flexible substrate 100, stress is discharged from the bending portion to outside when the flexible substrate 100 is bent. However, since there is no space between the adhesive layer 310 and the flexible substrate 100, the stress applied to the flexible substrate 100 is applied to a wide surface area of the adhesive layer.

In this regard, in the flexible display according to an embodiment, the adhesive layer 310 formed between the flexible substrate 100 and the protection film 300 is formed to have a plurality of patterns and formed to have a pattern gap 320 between a plurality of patterns, in which the adhesive layer 310 is absent, and thus, stress applied to the flexible substrate 100 during bending of the flexible substrate 100 may be dispersed and relieved.

The adhesive material for forming the adhesive layer 310 has flexible properties and adhesiveness and thus, the adhesive material becomes thinner due to tensile stress generated during the bending, stretches from the point at which the flexible substrate 100 is bent, and a space may be easily procured when the adhesive material is lengthened through the pattern gap 320, such that stress applied to the flexible substrate 100 may be effectively reduced.

As described above, FIG. 1 illustrates a case in which the adhesive layer 310 has a diamond-shaped pattern, but the adhesive layer 310 is not limited thereto and may have variously shaped patterns such as a polygonal shape, a circular shape, or an oval shape, in addition to the diamond shape. However, the flexible substrate 100 is bent in an x-axis direction or a y-axis direction and thus, the adhesive layer 310 may be formed to have a diamond-shaped pattern, in which a major axis and a minor axis of the pattern of the adhesive layer 310 may correspond to a bending axis of the flexible substrate 100. In this regard, when the flexible substrate 100 is bent, strength may be concentrated on an apex of the diamond-shaped pattern of the adhesive layer 310 to more flexibly react to changes in the length and thus, stress applied to the flexible substrate 100 may be relieved more effectively.

Figure 3:
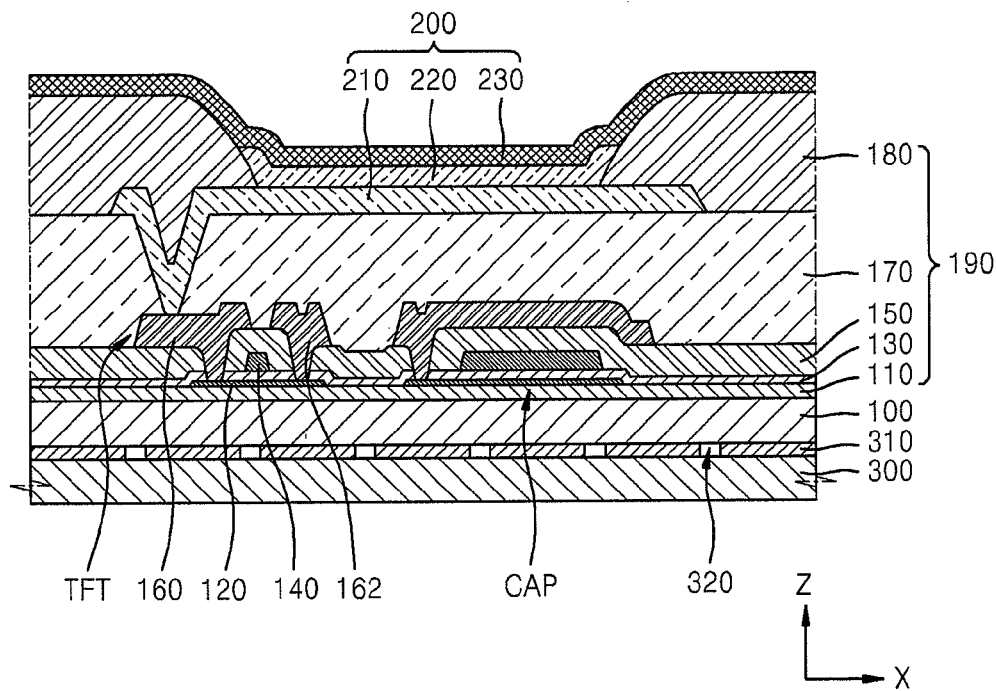
FIG. 3 is a cross-sectional view schematically showing an enlarged portion of FIG. 2.

FIG. 3 is a cross-sectional view schematically showing an enlarged portion of the flexible display device in FIG. 2. In other words, FIG. 3 illustrates a structure of display unit including an organic light-emitting device placed on the flexible substrate 100 according to an embodiment. Hereinafter, contents described for FIGS. 1 and 2 are omitted, and a schematic structure of the display unit placed on the flexible substrate 100 is described in greater detail. The display unit of the flexible display according to an embodiment described in FIG. 3 may be commonly applied to other embodiments.

As illustrated in FIG. 3, a thin film transistor layer 190 and the organic light-emitting device 200 are placed on the flexible substrate 100 to form a display layer (not shown). In the thin film transistor layer 190, various devices such as a capacitor CAP and a wiring unit may be formed, in addition to the thin film transistor TFT. On the thin film transistor layer 190, the organic light-emitting device 200 may be placed. The organic light-emitting device 200 may include a pixel electrode 210, a middle layer 220 including an emission layer, and a counter electrode 230. The structures of the thin film transistor layer 190 and the organic light-emitting device 200 are described with reference to FIG. 3.

The thin film transistor TFT formed on the flexible substrate 100 may include a semiconductor layer 120 including amorphous silicon, polycrystalline silicon, or an organic semiconductor material, a gate electrode 140, a source electrode 162, and a drain electrode 160. Hereinafter, a structure of the thin film transistor TFT is described in greater detail.

On the flexible substrate 100, a buffer layer 110 formed of silicon oxide or silicon nitride, for planarizing a surface of the flexible substrate 100 or for preventing penetration of impurities into the semiconductor layer 120, and the semiconductor layer 120 may be formed on the buffer layer 110.

On the semiconductor layer 120, the gate electrode 140 is formed, and the source electrode 162 electrically communicates with the drain electrode 160 according to a signal applied to the gate electrode 140. The gate electrode 140 may be formed as a single layer or a multi-layer of one or more materials selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of adhesion to a neighboring layer, flatness and formability of a surface of a layer to be layered.

In this regard, to insulate the semiconductor layer 120 and the gate electrode 140, a gate insulating layer 130 formed of silicon oxide and/or silicon nitride may be formed between the semiconductor layer 120 and the gate electrode 140.

An interlayer insulating layer 150 may be formed on the gate electrode 140, in which the interlayer insulating layer 150 may be formed as a single layer or a multi-layer formed of a material such as silicon oxide or silicon nitride.

The source electrode 162 and the drain electrode 160 may be formed on the interlayer insulating layer 150. Each of the source electrode 162 and the drain electrode 160 may be electrically connected to the semiconductor layer 120 through contact holes formed on the interlayer insulating layer 150 and the gate insulating layer 130. The source electrode 162 and drain electrode 160 may be formed as a single layer or a multi-layer of at least one material selected from, for example, Al, Pt, Pd, Ag, Mg, Au, Ni, Nd, Ir, Cr, Li, Ca, Mo, Ti, W, and Cu, in consideration of conductivity or the like.

For protection of the thin film transistor TFT of such structure or for planarization of the thin film transistor TFT, a protection layer 170 covering the thin film transistor TFT may be formed on the thin film transistor TFT. The protection layer 170 may be formed of an inorganic material such as silicon oxide, silicon nitride, or silicon oxynitride. FIG. 2 illustrates a case in which the protection layer 170 is a single layer, but various changes are possible, such as a case in which the protection layer 170 has a multi-layer structure.

Meanwhile, although not illustrated in FIG. 3, a second insulating layer as a planarization film for planarizing a top surface of the protection layer 170 covering the thin film transistor TFT may be formed on the flexible substrate 100. In this case, the planarization film may play a role like the protection layer 170, in protecting the thin film transistor TFT.

The protection layer 170 and the planarization film may be formed of an acrylic-based organic material, benzocyclobutene (BCB), or the like. In this regard, as illustrated in FIG. 3, the gate insulating layer 130, the interlayer insulating layer 150, the protection layer 170 and planarization film may be formed over substantially the entire surface of the flexible substrate 100.

Meanwhile, a pixel defining layer 180 may be formed on the thin film transistor TFT. The pixel defining layer 180 may be formed on the protection layer 170 described above or the planarization film and may have a hole. The pixel defining layer 180 may play a role in defining a pixel region on the flexible substrate 100.

The pixel defining layer 180 may be, for example, an organic insulating layer. The organic insulating layer may include an acrylic polymer such as polymethylmethacrylate (PMMA); polystyrene (PS); a polymer derivative having a phenol group; an imide polymer; an aryl ether-based polymer; an amide based polymer; a fluorine-based polymer; a p-xylene-based polymer, a vinyl alcohol-based polymer, and a mixture thereof.

Meanwhile, the organic light-emitting device 200 may be placed on the pixel defining layer 180. The organic light-emitting device 200 may include a pixel electrode 210, a middle layer 220 including an emission layer, and a counter electrode 230.

As illustrated in FIG. 3, the pixel electrode 210 may be formed on the pixel defining layer 180. In this case, an opening that exposes any one of the source electrode 162 and the drain electrode 160 of the thin film transistor TFT may be present in the protection layer 170, and the pixel electrode 210 may contact with any one of the source electrode 162 and the drain electrode of the thin film transistor TFT through the opening and electrically connect to the thin film transistor TFT.

The pixel electrode 210 may be formed as a (semi)transparent electrode or a reflective electrode. When the pixel electrode 210 is formed as a (semi)transparent electrode, the pixel electrode 210 may be formed of ITO, IZO, ZnO, $In_2O_3$, IGO, or AZO. When the pixel electrode 210 is formed as a reflective electrode, the pixel electrode 210 may include a reflective film formed of Ag, Mg, Al, Pt, Pd, Au, Ni, Nd, Ir, Cr, or a compound thereof or a layer formed of ITO, IZO, ZnO, $In_2O_3$, IGO, or AZO. The present invention is not limited thereto and the pixel electrode 210 may be formed of various materials, and various changes to the structure, such as a single layer or a multi-layer structure of the pixel electrode 210, are possible.

In the pixel region defined by the pixel defining layer 180, the middle layer 220 including the emission layer may be disposed. The middle layer 220 of the organic light-emitting device 200 may include the emission layer EML, and may further include a hole injection layer HIL, a hole transport layer HTL, an electron transport layer ETL, an electron injection layer EIL, and the like layered in a single-layered or a multi-layered structure. The middle layer 220 is not limited thereto and may have various structures.

The middle layer 220 may be formed of a low molecular weight organic material or a polymer organic material.

When the middle layer 220 is formed of a low molecular weight organic material, for example, a transparent or hole transport layers HTL, hole injection layers HIL, electron transport layers ETL, and electron injection layers EIL may be stacked around emission layers EML. Various other layers may be layered thereon as needed. Usable organic materials in this regard include copper phthalocyanine (CuPc), N'-di(naphthalene-1-yl)-N(N'-Di(naphthalene-1-yl)-N), N'-diphenyl-benzidine, tris-8-hydroxyquinoline aluminum (Alq3), and the like.

When the middle layer 220 is formed of a polymer organic material, the middle layer 220 may additionally include the HTL. The HTL may be formed of poly-(2,4)-ethylene-dihydroxy thiophene (PEDOT), polyaniline (PANI), or the like. In this regard, the usable organic material includes a polymer organic material such as a poly-phenylenevinylene-based (PPV) and polyfluorene-based polymer organic material. Also, an inorganic material may be further formed between the middle layer 220 and the pixel electrode 210 and the counter electrode 230.

In this regard, the HTL, the HIL, the ETL, and the EIL may be integrally formed over the entire surface of the substrate or only the EML may be formed for each pixel through an inkjet printing process. In this case, the HTL, the HIL, the ETL, the EIL, and the like may also be formed in the opening.

The counter electrode 230 that covers the middle layer 220 including the EML and counters the pixel electrode 210 may be formed over the entire surface of the flexible substrate 100. The counter electrode 230 may be formed as a (semi)transparent electrode or a reflective electrode.

When the counter electrode 230 is formed as a (semi)transparent electrode, a layer formed of a metal having a small work function such as Li, Ca, LiF/Ca, LiF/Al, Al, Ag, Mg and a compound thereof and a (semi)transparent conductive layer formed of ITO, IZO, ZnO or $In_2O_3$. When the counter electrode 230 is formed as a transparent electrode, the counter electrode 230 may include a layer formed of Li, Ca, LiF/Ca, LiF/Al, Al, Ag, Mg and a compound thereof. The composition and the material for the counter electrode 230 are not limited thereto and various changes to the counter electrode 230 are possible.

Figure 4:
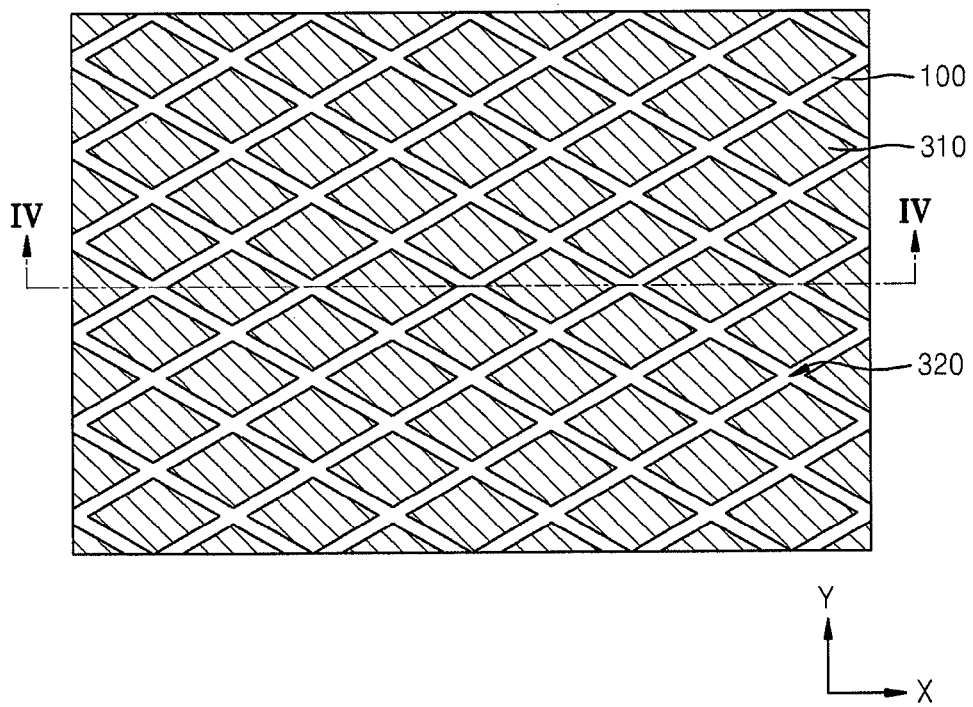
FIG. 4 is a bottom plan view schematically showing a flexible display according to another embodiment.
Figure 5:
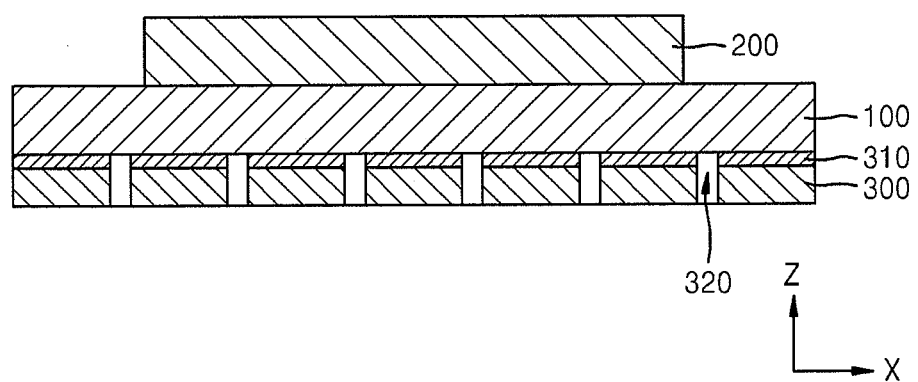
FIG. 5 is a cross-sectional view schematically showing a cross-section of the flexible display of FIG. 4 taken along a line IV-IV direction.

FIG. 4 is a bottom plan view schematically showing a flexible display according to another embodiment and FIG. 5 is a cross-sectional view schematically showing a cross-section of the flexible display of FIG. 4 taken along a IV-IV direction.

Referring to FIGS. 4 and 5, a flexible display according to another embodiment includes a flexible substrate 100, an organic light-emitting device 200 placed on the flexible substrate 100, a protection film 300, and an adhesive layer 310.

The flexible substrate 100 has flexible properties and may be formed of various materials such as a metal material and a plastic material such as PET, PEN, or polyimide, as described above.

The organic light-emitting device 200 may be placed on the flexible substrate 100 and includes a thin film transistor layer 190 and a plurality of pixels to form a display layer (not shown). For example, the display layer (not shown) may be an organic light-emitting display layer including a plurality of thin film transistors TFTs and pixel electrodes that are connected to the TFTs or a liquid crystal display layer (not shown).

The protection film 300 may be formed on one surface of the flexible substrate 100, in which the organic light-emitting device 200 is placed on the flexible substrate 100 and the protection film 300 may be formed under the flexible substrate 100. The protection film 300 may be formed on the entire surface of the flexible substrate 100. The protection film 300 may be attached under the flexible substrate 100 to protect the flexible substrate 100 from external scratches and improve durability of the flexible substrate 100. The protection film 300 may have flexible properties such as those of the flexible substrate 100 and may be formed of, for example, a plastic material such as PET, PEN, and polyimide.

The protection film 300 may be formed to have a plurality of patterns as illustrated in FIG. 4. In FIG. 4, the protection film 300 is illustrated to have a diamond-shaped pattern, but the protection film 300 is not limited thereto and may have various patterns such as a polygonal, a circular, or an oval-shaped pattern, in addition to the diamond-shaped pattern.

As described above, the protection film 300 may be formed to have a plurality of patterns, and thus, a pattern gap 320 may be formed between a plurality of patterns of the protection film 300, in which the protection film 300 is absent. The pattern gap 320 may have a size of about 0.05 mm to about 1 mm, for example, about 0.1 mm, but it is not limited thereto.

The adhesive layer 310 may be formed between the flexible substrate 100 and the protection film 300, such that the protection film 300 may be attached to the flexible substrate 100. The adhesive layer 310 may be formed of silicon, but any material that has adhesive properties may be used. The adhesive layer 310 may have sufficient adhesiveness to attach the protection film 300 to the flexible substrate 100 and have adhesiveness of about 0.01 kgf/cm$^2$ to about 10 kgf/cm$^2$, but the adhesive layer 310 is not limited thereto.

As described above, the protection film 300 is formed to have a plurality of patterns, and thus, the adhesive layer 310 that attaches the protection film 300 to the flexible substrate 100 may also be formed according to the shape of the protection film 300. In other words, the adhesive layer 310 may be formed to have a plurality of patterns according to the shape of the protection film 300. When the protection film 300 has a diamond-shaped pattern as illustrated in FIG. 4, the adhesive layer 310 may also be formed to have a diamond-shaped pattern.

Also, in the pattern gap 320 formed between the patterns in the protection film 300, in which the protection film 300 is absent, the adhesive layer 310 may also be absent. In other words, the adhesive material may not be formed between the patterns of the protection film 300. Accordingly, since the protection film 300 and the adhesive layer 310 are not formed in the pattern gap 320, the flexible substrate 100 may be exposed through the pattern gap 320. As described above, the pattern gap 320 is a minute gap of about 0.1 mm, and thus, even when the protection film 300 has the pattern gap 320, the protection film 300 may still sufficiently protect the flexible substrate 100.

Alternatively, when the adhesive layer is formed between the protection film and the flexible substrate over the entire surface of the flexible substrate, tensile and pressure stress is applied to a bending portion when the flexible substrate 100 is bent. In this regard, when the adhesive layer 310 is formed over the entire surface of the flexible substrate 100, stress is discharged from the bending portion to outside when the flexible substrate 100 is bent. However, since there is no space between the adhesive layer 310 and the flexible substrate 100, stress applied to the flexible substrate 100 is applied to a wide surface area of the adhesive layer.

In the flexible display according to an embodiment, the protection film 300 formed under the flexible substrate 100 and the adhesive layer 310 are formed to have a plurality of patterns, and the pattern gap 320 in which the protection film 300 and the adhesive layer 310 are absent may be formed between the patterns, such that stress applied to the flexible substrate 100 during bending of the flexible substrate 100 may be dispersed and relieved.

The adhesive material for forming the adhesive layer 310 has flexible properties and adhesiveness and thus, the adhesive material becomes thinner due to tensile stress generated during the bending, stretches from the point at which the flexible substrate 100 is bent, and a space may be easily procured when the adhesive material is lengthened through the pattern gap 320, such that stress applied to the flexible substrate 100 may be effectively reduced.

Hereinbefore, the flexible display was primarily described, but the present invention is not limited thereto. For example, a method of manufacturing the flexible display may also belong to a scope of the invention.

Figure 6:
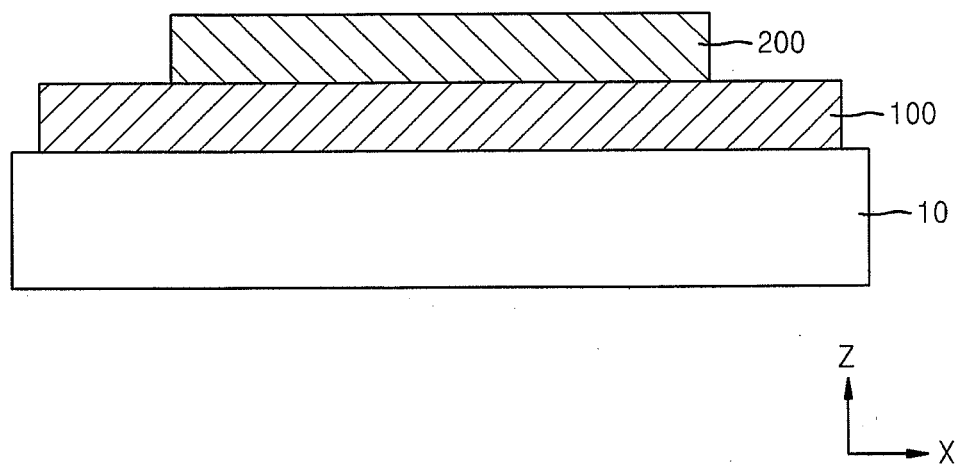
FIGS. 6 to 8 are cross-sectional views schematically showing manufacturing processes of a flexible display according to another embodiment.
Figure 7:
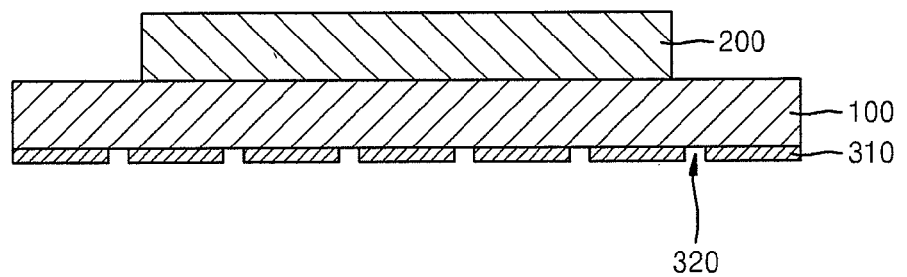
Figure 8:
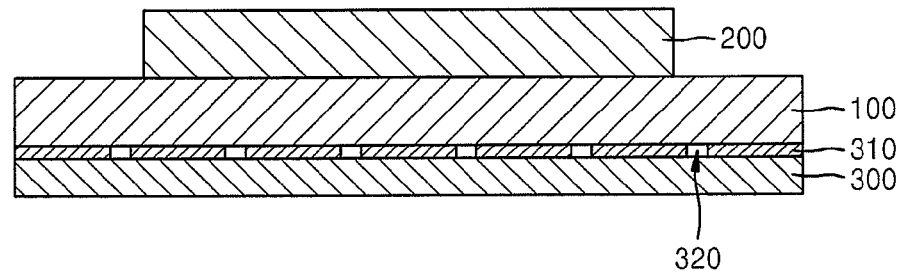

FIGS. 6 to 8 are cross-sectional views schematically showing manufacturing processes of a flexible display according to another embodiment.

Referring to FIG. 6, the flexible substrate 100 may pass through a preparation process. In more detail, the flexible substrate 100 may be formed on the support substrate 10. The substrate 10 may be formed of various materials, for example, glass, metal, or a plastic material. The flexible substrate 100 may be formed of a plastic material such as PET, PEN, and polyimide; and a polymer material such as PBO, PBI, polyoxadiazole (POD), polytriazole, and polyacrylonitirile (PAN).

After forming the flexible substrate 100 on the support substrate, an organic light-emitting device may be formed on the flexible substrate 100. Although not shown in FIG. 6, various devices such as a thin film transistor TFT and a capacitor CAP may be formed between the flexible substrate 100 and the organic light-emitting device as described above.

Referring to FIG. 7, a process in which the flexible substrate 100 is separated from the support substrate may be performed. Thereafter, the adhesive layer 310 may be formed on one surface of the flexible substrate 100 separated from the support substrate 10. In this regard, the adhesive layer 310 may be formed to have a plurality of patterns. In the embodiments of the present invention described above, the adhesive layer 310 is illustrated to have a diamond-shaped pattern, but the adhesive layer 310 is not limited thereto, and the pattern of the adhesive layer 310 may have variously shaped patterns as needed. For example, the adhesive layer 310 may have a polygonal pattern such as a diamond-shaped pattern, but the adhesive layer 310 may be variously changed to have a circular or an oval-shaped pattern.

Also, FIG. 7 illustrates a case in which the adhesive layer 310 is directly formed under the flexible substrate 100 separated from the support substrate 10, but the structure is not limited thereto and may have a structure in which the adhesive layer 310 is formed on the protection film 300.

Since the adhesive layer 310 has a plurality of patterns, an adhesive material may not be formed in the pattern gap 320 between the plurality of patterns. The pattern gap 320 may have a size of about 0.05 mm to about 1 mm, for example, about 0.1 mm, but it is not limited thereto.

Thereafter, referring to FIG. 8, the protection film 300, on which the adhesive layer 310 is formed, may be formed under the flexible substrate 100. Since the flexible substrate 100 is formed of a plastic material that has lower rigidity than a glass substrate, the protection film 300 may be attached under the flexible substrate 100 to protect the flexible substrate 100 from external scratches and improve durability of the flexible substrate 100.

In this regard, in the flexible display according to an embodiment, the adhesive layer 310 formed between the flexible substrate 100 and the protection film 300 is formed to have a plurality of patterns and formed to have a pattern gap 320 between a plurality of patterns, in which the adhesive layer 310 is absent, such that stress applied to the flexible substrate 100 during bending of the flexible substrate 100 may be dispersed and relieved.

The adhesive material for forming the adhesive layer 310 has flexible properties with adhesiveness and thus, the adhesive material becomes thinner due to tensile stress generated during the bending, stretches from the point at which the flexible substrate 100 is bent, and a space may be easily procured when the adhesive material is lengthened through the pattern gap 320, such that stress applied to the flexible substrate 100 may be effectively reduced.

As described above, according to at least one of the disclosed embodiments, a flexible display is relieved from stress during folding.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. A flexible display comprising:
   a flexible substrate having first and second surfaces opposing each other;
   an organic light-emitting device on the first surface of the flexible substrate and configured to emit light;
   a protection film attached to the second surface of the flexible substrate and including a plastic material having flexibility, wherein the protection film remains attached to the second surface of the flexible substrate when the organic light-emitting device emits light; and
   a layer of adhesive material having a uniform thickness, formed between the flexible substrate and the protection film and directly contacting the flexible substrate and the protection film, wherein a plurality of patterns are uniformly formed in at least part of the adhesive layer, and a pattern gap is formed between the plurality of patterns in which the adhesive material is absent.

2. The flexible display of claim 1, wherein the plurality of patterns comprise a polygonal, a circular, or an oval-shaped pattern.

3. A flexible display comprising:
   a flexible substrate having first and second surfaces opposing each other;
   an organic light-emitting device on the first surface of the flexible substrate and configured to emit light;
   a protection film attached to the second surface of the flexible substrate and including a plastic material having flexibility, wherein the protection film remains attached to the second surface of the flexible substrate when the organic light-emitting device emits light, and wherein a first plurality of patterns are uniformly formed in at least part of the protection film; and
   a layer of adhesive material having a uniform thickness, formed between the flexible substrate and the protection film and directly contacting the flexible substrate and the protection film, wherein a second plurality of patterns correspond to the first plurality of patterns and a pattern gap is formed between the second plurality of patterns in which the adhesive material is absent.

4. The flexible display of claim 3, wherein each of the first plurality of patterns and the second plurality of patterns comprises a polygonal, a circular, or an oval-shaped pattern.

5. The flexible display of claim 4, wherein the protection film is not formed between the patterns of the protection film.

6. The flexible display of claim 4, wherein the flexible substrate is exposed between the patterns of the protection film.

7. The flexible display of claim 1, wherein the protection film and the adhesive layer have the same patterns.

8. The flexible display of claim 7, wherein each of the patterns has a diamond shape.

9. The flexible display of claim 3, wherein the first plurality of patterns are formed in areas of the protection film and the second plurality of patterns are formed in areas of the adhesive layer, which correspond to an area of the flexible substrate.

* * * * *